United States Patent [19]

Tortorello et al.

[11] Patent Number: 5,847,021
[45] Date of Patent: Dec. 8, 1998

[54] SOLVENT-FREE, RADIATION-CURABLE, OPTICAL GLASS FIBER COATING COMPOSITION AND SOLVENT-FREE METHOD FOR MAKING A SOLVENT-FREE, RADIATION-CURABLE, OPTICAL GLASS FIBER COATING COMPOSITION

[75] Inventors: Anthony J. Tortorello, Elmhurst; Edward J. Murphy, Arlington Heights, both of Ill.

[73] Assignee: DSM N.V., Heerlen, Netherlands

[21] Appl. No.: 740,725

[22] Filed: Nov. 1, 1996

Related U.S. Application Data

[60] Provisional application No. 60/007,209, Nov. 3, 1995.
[51] Int. Cl.$^6$ ............................ C08L 75/06; C08L 75/08; C08L 75/16; C08F 2/50
[52] U.S. Cl. .............................. 522/90; 522/91; 522/93; 522/96; 528/65; 528/363; 528/366; 385/145; 428/378
[58] Field of Search ................................ 522/90, 91, 96, 522/93; 528/65, 363, 366; 385/145; 428/378

[56] References Cited

U.S. PATENT DOCUMENTS

| | | |
|---|---|---|
| 3,694,415 | 9/1972 | Honda et al. . |
| 3,719,638 | 3/1973 | Huemmer et al. . |
| 4,537,667 | 8/1985 | Bishop et al. . |
| 5,139,872 | 8/1992 | Lapin et al. ............................... 522/96 |
| 5,171,760 | 12/1992 | Kaszas et al. . |
| 5,352,712 | 10/1994 | Shustack ................................... 522/96 |

FOREIGN PATENT DOCUMENTS

| | | |
|---|---|---|
| A-204497 | 12/1986 | European Pat. Off. . |
| 57-012021 | 1/1982 | Japan . |
| 1281898 | 7/1972 | United Kingdom . |

*Primary Examiner*—Susan W. Berman
*Attorney, Agent, or Firm*—Pillsbury Madison & Sutro

[57] ABSTRACT

The invention relates to a solvent-free radiation curable, optical glass fiber coating composition containing:
a) a urethane oligomer having a functional group capable of polymerization in the presence of actinic radiation, with an average functionality of at least about 1.2, having a vinyl addition polymer as backbone.
b) a urethane compound having a functional group capable of polymerization in the presence of actinic radiation, with an average functionality of at least about 1, containing an organic moiety having about 5 or more carbon atoms as backbone.
c) a reactive diluent.

Furthermore, the invention relates to a solvent-free method for producing a solvent-free, radiation curable urethane oligomer composition.

27 Claims, No Drawings

SOLVENT-FREE, RADIATION-CURABLE, OPTICAL GLASS FIBER COATING COMPOSITION AND SOLVENT-FREE METHOD FOR MAKING A SOLVENT-FREE, RADIATION-CURABLE, OPTICAL GLASS FIBER COATING COMPOSITION

This application claims priority to provisional application Ser. No. 60/007,209, filed on Nov. 3, 1995.

I. FIELD OF THE INVENTION

This invention relates to a solvent-free, radiation-curable, optical glass fiber coating composition. The invention also relates to a solvent-free method for making a solvent-free, radiation-curable, optical glass fiber coating composition containing a vinyl addition copolymer.

II. BACKGROUND OF THE INVENTION

In the production of optical glass fibers, one or more coating layers are usually applied to the optical glass fibers immediately after drawing to protect the glass surface from detrimental moisture and/or mechanical attack which would otherwise occur. These coating layers have been formed from UV-curable coating compositions consisting of organic UV-curable oligomers, reactive diluents, thermal intitiators, photo-initiators, stabilizers, and coupling agents. These UV-curable coating compositions should be solvent-free.

UV-curable coating compositions used in telecommunications sometimes include a UV curable urethane acrylate oligomer containing a vinyl copolymer. According to EP-A-204497, urethane acrylates having a vinyl addition polymer as backbone are not well suitable for use in optical fiber coating compositions. A further disadvantage in the use of UV-curable urethane acrylate oligomers containing a vinyl copolymer is caused by the fact that, in current practice, the vinyl copolymer is first synthesized in a solvent and then a functional group present on the vinyl copolymer is subjected to a further reaction so as to provide an acrylate functional group on the copolymer. The solvent(s) is then removed from the acrylated vinyl copolymer to provide a substantially solvent-free composition.

Such a process is disclosed in U.S. Pat. No. 4,537,667. In this patent, a UV-curable copolymer is synthesized in a solvent that is later removed. The solvent can be inorganic or organic. In Example 1 of this patent, both an inorganic solvent and an organic solvent were used to synthesize the UV-curable copolymer and then they were removed. The solvent is commonly a relatively volatile solvent and the removal thereof frequently requires use of a vacuum.

However, it is very difficult to remove the last traces of the solvent under conditions which will not adversely affect the nature of the urethane acrylate copolymer. Thus, almost invariably traces of solvent will remain in the UV-curable coating composition, which may undesirably affect the properties of the cured coating.

Furthermore, the removal of the solvent is an additional step which requires the use of additional equipment, energy consumption, and is environmentally unfriendly. Many solvents cause undesirable effects on humans and the environment, and thus special equipment is required to prevent contamination of the environment or exposure to humans. All of these aspects add considerably to the cost of the composition.

Other teachings in the prior art have referred to the use of reaction solvents which are free from active hydrogen atoms such as are on hydroxyl groups; see U.S. Pat. Nos. 3,694,415 and 3,719,638, and U.K. Specification 1,281,898. U.S. Pat. No. 5,171,760, described the undesirable aspects of solvent-based reaction systems; however, it uses a different technological approach from that of the present invention. Japanese published application 5 701 2021 describes a still different approach of using an unsaturated urethane oligomer for reaction with an hydroxy-group containing vinyl polymer.

There is and has been a need for an effective method of preparing a solvent-free, radiation-curable coating composition which does not require the use of a solvent that must be removed.

SUMMARY OF THE INVENTION

It is an object of the present invention to provide a solvent-free radiation curable, optical glass fiber coating composition. Another object of the present invention is to provide a solvent-free method for making a solvent-free, radiation-curable, optical glass fiber coating composition containing a vinyl addition copolymer made in the absence of a solvent that must be removed.

The above objectives and other objectives are obtained by the following novel and innovative products and procedures.

It has been found that very useful solvent-free, radiation curable, optical glass fiber coating compositions contain:

a) a urethane oligomer having a functional group capable of polymerization in the presence of actinic radiation with an average functionality of at least about 1.2, having a vinyl addition polymer as backbone, b) a urethane compound having a functional group capable of polymerization in the presence of actinic radiation with an average functionality at least about 1, containing an organic moiety having about 5 or more carbon atoms as backbone.

c) a reactive diluent.

The word "backbone" is used to denote the group, oligomer or polymer to which radiation curable groups are attached via urethane linkages. In a simplified formula, this can be shown as follows.

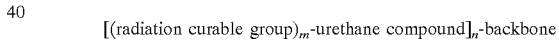

in which m is the number of urethane groups of the urethane compound minus 1, the urethane compound is a molecule comprising two or more urethane groups, and n is the functionality of the backbone.

Furthermore, it has now been found that a solvent free, radiation curable optical glass fiber coating composition in which the backbone is a vinyl addition copolymer can be produced in the absence of a solvent, thereby avoiding a solvent removal step.

The method of this invention consists essentially of the steps of forming a hydroxy-functional vinyl addition copolymer by reacting a first ethylenically-unsaturated, hydroxy-functional co-polymerizable monomer (hereinafter "hydroxy-functional monomer") with a second ethylenically-unsaturated co-polymerizable monomer in the presence of a reaction medium composed of a reactive hydroxy-functional diluent, but otherwise in the absence of a solvent, whereby said hydroxy-functional vinyl addition copolymer is obtained as a dispersion or solution in the hydroxy-functional diluent.

Alternatively, the vinyl addition copolymer may be first formed by reaction of the hydroxy-functional monomer and said second ethylenically-unsaturated monomer, in the absence of a solvent, to obtain the vinyl addition copolymer which is subsequently dispersed or dissolved in said reactive hydroxy-functional diluent.

Thereafter, a mono-functional isocyanate compound having radiation-curable functional group(s) capable of polymerization in the presence of actinic radiation is reacted with the dispersion or solution of the hydroxy-functional vinyl addition copolymer in the reactive hydroxy-functional diluent, but otherwise in the absence of a solvent, thereby obtaining a mixture of a first urethane oligomer formed from the hydroxy-functional vinyl addition copolymer and a second urethane oligomer formed from the hydroxy-functional diluent. Hence, the hydroxy-functional vinyl addition copolymer constitutes the backbone for urethane oligomer (a), and the hydroxy functional diluent constitutes the backbone for urethane compound (b).

It will be appreciated that as used herein the term "reactive hydroxy-functional diluent" contemplates a composition capable of serving as the reaction medium for the copolymerization reaction and/or for the urethane forming reaction and also of participating by reaction with the isocyanate reagent to form a urethane entity.

It will also be understood that in the practice of this invention, the said "ethylenically-unsaturated, hydroxy-functional co-polymerizable monomer" may actually comprise, as may be desired, a mixture of more than one such monomers. Similarly, the said "second ethylenically-unsaturated co-polymerizable monomer" may also comprise, as may be desired, a mixture of such monomers. When either phrase is used, such respective mixtures are contemplated, unless otherwise indicated. Similarly, the said "vinyl addition copolymer" and/or the "hydroxy functional diluent" may also comprise, as may be desired, a mixture of such copolymers and/or diluents.

Further, as used herein, the phrase "a solvent that must be removed" refers to solvents which have been typically employed in the past as a reaction medium and in sufficient amounts as to require their removal from the coating composition, at one stage or another in the preparation thereof, and/or prior to application of the composition to the optical glass fiber. The phrase does not include the reactive hydroxy-functional functional diluents used herein even though the monomer reactants or the hydroxy-functional vinyl addition copolymer may, in whole or in part, be dissolved in the diluent. In the practice of this invention the step of solvent removal may be wholly or substantially avoided.

In effect, this invention lies in part in the discovery, and the technique described herein, of employing as the reaction medium for the urethane-forming step a reactive hydroxy-group-containing component which is reactive with the isocyanate component, so as to then take part in the urethane-forming reaction, and without the use of a solvent which would require its later removal. Desirably, the hydroxy-group-containing diluent is also used as the reaction medium for the formation of the hydroxy-functional vinyl addition copolymer, in which case it can remain with the copolymerization product for the next stage of urethane formation.

This inventive method has the further advantage that the properties of the final UV-curable composition may be readily adjusted to achieve various desired characteristics of the coating. For instance, the Tg of the final urethane-oligomer mixture can be easily adjusted to a desired value by varying the amount and type of monomer or monomers used in the copolymerization step, and/or by varying the amount of the reactive hydroxy-functional reactive diluent. Furthermore, the viscosity of the final urethane-oligomer mixture can be roughly adjusted by varying the amount and type of the monomer or monomers used, and then fine-tuned by the level of use of the hydroxy diluent.

It will be further understood that many of the advantages of this invention may be realized by employing for the isocyanate urethane-forming reaction a pre-formed hydroxy-functional vinyl addition copolymer, or mixtures of such vinyl addition copolymers, regardless of whether such copolymers were initially formed with a solvent, provided that such solvent had been removed therefrom. Such vinyl addition copolymer(s) may thereafter be subjected to the urethane-forming reaction with the isocyanate while dispersed or dissolved in the hydroxy-functional diluent, in the absence of other conventional solvents or inert reaction mediums.

The invention also provides a novel solvent-free, radiation-curable, optical glass fiber coating composition made by the above method.

DETAILED DESCRIPTION OF PREFERRED EMBODIMENTS

The solvent free, radiation curable optical glass fiber coating composition comprises a) a urethane oligomer having a functional group capable of polymerization in the presence of actinic radiation, with an average functionality of at least about 1.2, having a vinyl addition polymer as backbone.

b) a urethane compound having a functional group capable of polymerization in the presence of actinic radiation, with an average functionality at least about 1, containing an organic moiety having about 5 or more carbon atoms as backbone.

c) a reactive diluent, d) optionally a photosensitive radical generating compound, and e) optionally additives.

The functionality refers to the average number of radiation-curable functional groups per oligomer (a) or compound (b).

The urethane oligomer with the radiation-curable functional group and having the vinyl addition polymer as backbone in general has a number average molecular weight between about 1000 to about 200,000, preferably between about 2000 to about 100,000. The average functionality of the oligomer (a) is at least about 1.2, preferably at least about 1.8. The average functionality in general is lower than about 20, preferably lower than about 15.

The radiation-curable functional group is capable of polymerization through actinic radiation, for example, ultraviolet or electron-beam radiation. One type of functionality is, for example, an ethylenic unsaturation, which in general is polymerized through radical polymerization, but can also be polymerized through cationic polymerization. Examples of ethylenic unsaturation are groups containing acrylate, vinylether, methacrylate or acrylamide functionality. Another type of functionality is provided by, for example, epoxy groups, or thiol-ene or amine-ene systems. Epoxy groups, in general, can be polymerized through cationic polymerization, whereas the thiol-ene and amine-ene systems are polymerized through radical polymerization. The epoxy groups can be, for example, homopolymerized. In the thiol-ene and amine-ene systems, for example, polymerization can occur between a group containing allylic unsaturation a group containing a tertiary amine or thiol. Preferably, the radiation-curable functional group is an acrylate group, a methacrylate group, or a vinylether group. Most preferably, the radiation-curable functional group is an acrylate group.

The urethane oligomer (a) has a vinyl addition polymer as backbone. In general, the vinyl addition polymer has hydroxyl groups for reaction with an isocyanate compound.

In general, the content of hydroxyl groups per gram of vinyl addition polymer is between 0.01 and 2.5 meq/g, preferably between 0.05–1.0 meq/g.

The calculated Tg of the vinyl-addition polymer preferably is between about −60° C. to about 80° C., depending on the desired use. In particular, the Tg of the polymer preferably is lower than about 0° C., more in particular lower than about −20° C.

The urethane compound (b) in general has a number average molecular weight between about 300 to about 10,000, preferably between about 300 to about 5000. The average functionality of compound (b) is about one or higher, and preferably about one, two or three. The backbone of this urethane compound may be a hydrocarbon, a polyether, a polyester, a polycarbonate, a silicone or a fluorocarbon. Particularly preferred are hydrocarbons or polyethers. The molecular weight of these backbone materials may be between 100 and about 10,000, and is preferably about 100 to about 5,000. These backbone materials will have hydroxyl groups for reaction with isocyanates. Hence, mono alcohols or polyfunctional alcohols are used as backbone materials. Molecular weight for the polymeric materials is understood to be the weight-average molecular weight or the theoretical calculated molecular weight of the polymeric material based on the reactants and reaction conditions.

Suitable examples of hydrocarbon poly- or mono-ols include:
hexanol,
cyclohexylmethanol,
2-ethylhexanol,
decylalcohol,
stearylalcohol,
1,2- or 1,4-polybutadiene-diol,
hydrogenated polybutadienediol,
hydrogenated-bisphenol-A, and the like.

Suitable examples of polyether mono- or polyalcohols, include:
alkoxylated bisphenol-A,
polypropylene-glycol,
alkoxylated alkylphenol compounds,
polytetramethylene glycol,
copolymers of tetrahydrofuran and methyltetrahydrofuran,
ethoxylated monoalcohols like ethoxyethoxy-2-ethylhexanol, alkoxylated trimethylolpropane,
and the like.

Suitable examples of hydroxy functional polyesters include esterification products of diols and diacids. Examples of suitable polycarboxylic acids include:
adipic acid,
terephthalic acid,
phthalic acid anhydride,
decanoic-diacid, and
hexahydrophthalic acid.

Suitable poly hydroxy compounds include:
ethylene glycol,
propylene glycol,
1,2-butanediol,
1,4-butenediol,
neopentylglycol,
diethyleneglycol,
and the like.
Suitable hydroxy functional polyesters can also be made with caprolactone, e.g. by ring opening polymerization of mono-, di- or triols with caprolactone. Suitable alcohols are, for example;
butanol,
hexanol,
stearylalcohol,
ethyleneglycol,
propylene glycol,
trimethylolpropane,
alkoxylated trimethylolpropane,
and the like.

Suitable polycarbonates include polycarbonates based on 1,6-hexanediol, diethyleneglycol, 1,2,- dodecanediol, bisphenol-A and the like.

The reactive diluent (c) preferably has a molecular weight less than about 550, or a viscosity at room temperature less than about 300 mPa.s (measured as 100% diluent). Often a mixture of diluent (c) is used.

Preferably, reactive diluent (c) comprises a monomer or monomers having an acrylate, N-vinyl or vinylether functionality and an $C_4$–$C_{20}$ alkyl or polyether moiety. Examples of such reactive diluents include:
hexylacrylate,
2-ethylhexylacrylate,
isobornylacrylate,
decylacrylate,
laurylacrylate,
stearylacrylate,
laurylvinylether,
ethoxyethoxyethylacrylate,
2-ethylhexylvinyl ether,
N-vinyl formamide,
isodecyl acrylate,
isooctyl acrylate,
vinyl-caprolactam,
N-vinylpyrrolidone, and the like. This type of reactive diluent—if used—preferably is present in an amount between about 1 and about 35 wt. %.

Another preferred type of reactive diluent (c) is a compound comprising an aromatic group. with the aid of a compound having an aromatic moiety, the refractive index of the coating composition can be adjusted to a value above 1.48, which may be advantageous if the coating is used as an optical fiber coating. Examples of diluents having an aromatic group include:
ethyleneglycolphenyletheracrylate,
polyethylene-glycolphenyletheracrylate,
polypropyleneglycolphenylether-acrylate, and
alkyl-substituted phenyl derivatives of the above monomers, such as polyethylene-glycolnonylphenyl-etheracrylate. This type of reactive diluent—if used—preferably is present in an amount between about 1 and about 35 wt. %.

Furthermore, reactive diluent (c) may comprise a diluent having two radiation-curable functional groups capable of polymerization using actinic radiation. A diluent having three or more of such reactive groups can be present as well. Examples of such monomers include
$C_2$–$C_{18}$ hydrocarbondioldiacrylates,
$C_4$–$C_{18}$ hydrocarbondivinylethers,
$C_3$–$C_{18}$ hydrocarbon triacrylates,
the polyether analogues thereof, and the like,
such as 1,6-hexanedioldivinylether,
triethyleneglycoldivinylether,
hexanedioldivinylether,
triethyleneglycoldiacrylate,
pentaerythritoltriacrylate,
ethoxylated bisphenol-A diacrylate, and
tripopyleneglycol diacrylate.

If the radiation-curable functional group of the urethane oligomer is an epoxy group, for example, one or more of the following compounds can be used as the reactive diluent:

epoxy-cyclohexane,
phenylepoxyethane,
1,2-epoxy-4-vinylcyclohexane,
glycidylacrylate,
1,2-epoxy-4-epoxyethyl-cyclohexane,
the diglycidylether of polyethylene-glycol,
the diglycidylether of bisphenol-A, and the like.

If the radiation-curable functional group of the urethane oligomer is an amine-ene or thiol-ene system, examples of reactive diluents having allylic unsaturation that can be used include:
diallylphthalate,
triallyltrimellitate,
triallylcyanurate,
triallylisocyanurate, and
diallylisophthalate.

For the amine-ene systems, amine functional diluents that can be used include, for example:
the adduct of trimethylolpropane, isophoronediisocyanate and di(m)ethylethanolamine,
the adduct of hexanediol, isophoronediisocyanate and dipropylethanolamine, and
the adduct of trimethylolpropane, trimethylhexamethylene-diisocyanate and di(m)ethylethanolamine".

Urethane oligomer (a) preferably is present in the solvent free optical fiber coating composition in an amount between about 5 wt. % to about 70 wt. %, more preferably in an amount between about 15 and about 50 wt. % (with respect to the total composition).

The urethane compound (b) preferably is present in an amount between about 5 wt. % to about 70 wt. %, more preferably in an amount between about 15 to about 50 wt. %

The reactive diluent (c), or mixture of diluents is present, preferably in an amount between about 5 to about 70 wt. %, preferably in an amount between about 10 to about 70 wt. %.

Preferably, the viscosity of the solvent free radiation curable optical glass fiber coating is between about 0.1 Pa.s and about 100 Pa.s (25° C.)

The solvent free radiation curable optical glass fiber coating further comprise preferably one or more photoinitiators (i.e. one or more photosensitive radical generating compounds) in an amount between about 0.1 and about 10 wt. %

Examples of free radical-type photoinitiators include, but are not limited to, the following: hydroxycyclohexylphenyl ketone; hydroxymethylphenylpropanone; dimethoxyphenylacetophenone; 2-methyl-1-[4-(methyl thio)-phenyl]-2-morpholinopropanone-1; 1-(4-isopropylphenyl)-2-hydroxy-2-methylpropan-1-one; 1-(4-dodecyl-phenyl)-2-hydroxy-2-methylpropan-1-one; 4-(2-hydroxyethoxy)phenyl-2(2-hydroxy-2-propyl)-ketone; diethoxyphenyl acetophenone; 2,4,6 trimethylbenzoyl diphenylphosphine-oxide, a mixture of (2,6-dimethoxy benzoyl)-2,4,4-trimethylpentylphosphineoxide and 2-hydroxy-2-methyl-1-phenyl-propan-1-one, and mixtures of these.

Examples of cationic cure-type photoinitiators include, but are not limited to, onium salts such as: iodonium, sulfonium, arsonium, azonium, bromonium, or selenonium. The onium salts are preferably chemically modified to render them more hydrophobic, for example, by incorporating saturated hydrocarbon moieties such as alkyl or alkoxy substituents of from about 4 to about 18 carbon atoms. Preferred cationic cure initiators include:
(4-octyloxyphenyl) phenyl iodonium hexafluoro antimonate;
(4-octyloxyphenyl) diphenyl sulfonium hexafluoroantimonate;
(4-decyloxyphenyl) phenyl iodonium hexafluoro antimonate; and (4-octadecyloxyphenyl) phenyl iodonium hexafluoro antimonate.

In producing a coated optical fiber, a liquid coating composition is applied to a substrate and subsequently cured. Typically, the cure is affected using ultraviolet or visible radiation. However, other methods are available. For example, thermal curing, usually in the presence of an initiator, can be used. Alternatively, the coating can be cured by electron beam irradiation where no catalyst is required. More than one coating can be applied. Typically, a first coating is applied and cured followed by a second coating and so on until the desired number of coatings have been applied. Alternatively, the layers can be applied on top of each other as liquids, typically referred to as a wet-on-wet process, with one final curing step at the end.

In many applications involving optical fibers it is desirable to have an outermost layer (outer primary layer) that is tough or hard enough to protect the optical fiber and underlying coatings, including an inner primary coating. The underlying coatings and inner primary coating are typically softer in comparison to the outermost coating. Surprisingly, it was found that with the composition of the present invention one can provide both an inner primary coating having good strength characteristics and an outer primary coating having the required properties.

In particular, the coating compositions according to the present invention provide excellent outdoor durability, resistance to discoloration and excellent mechanical properties.

In particular, the inner primary coatings, when cured possess a modulus of less than about (10 MPa) preferably less than about 5 MPa and a glass transition temperature lower than about −20° C., and preferably less than about −30° C.

The outer primary (or secondary) coatings have preferably a modulus of about 500 to about 1500 MPa, and a glass transition temperature higher than about 50° C.

Because of the useful properties obtainable with the coating composition, in a coated optical fiber comprising an inner primary coating and an outer primary coating, it is part of this invention to have either the inner primary coating, or the outer primary, or both being a cured composition according to the invention.

If the coating composition of the present invention is used as an inner primary coating, the composition preferably comprises an effective amount, for example about 0.3 to about 5 wt. %, of adhesion promoting compounds such as for example γ-mercaptopropyl trimethoxysilane or (meth)acryloxyalkyltrimethoxysilane.

Coated optical fibers are often used in ribbons, being flat bands comprising a plurality of coated optical fibers, mostly between about 4 and about 12, covered with an integral covering layer. This covering layer is often denoted as matrix material. The individual coated optical fibers are often colored with an UV-curable ink. Because of the versatility of the presently invented coating composition, this composition is very well suited as matrix material. In case the resin composition is used as a matrix material, preferably a release agent is comprised by the coating to allow easy access to the individual fibers. Suitable release agents are silicones, silicone acrylates, fluoro-carbon oils or resins and the like. Preferably, the optical fiber coating composition for coating a plurality of optical fibers comprises about 0.5 to about 20 wt. % of a suitable release agent.

Coated optical fibers are often covered with an ink layer of about 5 to about 10 μm thickness in order to color the individual fibers to allow recognition of the fibers at the ends of a bundle of fibers. The urethane oligomer mixture can be used as vehicle for pigments to make radiation curable ink compositions for optical fibers. In general, an ink composition comprises about 2 to about 30 wt. % of pigment.

Dual coated fibers, optionally with a colored ink layer in general have a thickness of about 200 to about 250 μm. In case the fiber is used in local area network, it might be necessary to have fibers with a thickness of about 400 to about 900 μm for improved manual handling and for further protection of the dual coated and colored fiber. The coating composition according to the present invention is very well suitable as such an "upjacketing coating", i.e. as coating to enhance the thickness of the dual coated and optionally colored fiber.

Preferred methods of preparation of the compositions according to the inventions are described below.

The hydroxy-functional monomer and the second ethylenically-unsaturated monomer can be reacted together by heating in the presence of the hydroxy-functional diluent until the hydroxy-functional monomer and said second ethylenically-unsaturated monomer co-polymerize to produce a hydroxy-functional vinyl addition copolymer which is dispersed or dissolved in the hydroxy-functional diluent. The hydroxy-functional monomer and said second ethylenically-unsaturated monomer each contain a functional group having ethylenic unsaturation whereby when the monomers are heated to a reaction temperature, a co-polymerization reaction involving the ethylenic unsaturation of the monomers occurs to form a hydroxy-functional vinyl addition copolymer.

Examples of suitable ethylenic unsaturation are groups containing acrylate, methacrylate, styrene, vinylether, vinyl ester, N-substituted acrylamide, N-vinyl amide, maleate esters, and fumarate esters. Preferably, the ethylenic unsaturation is provided by a group containing acrylate, methacrylate, or styrene functionality. More than one of the monomers may be employed in admixture with the other one, as desired. Preferably, divinyl ethylenic unsaturation is avoided because the resulting hydroxy-functional vinyl addition copolymer may be prone to gelling.

It is also possible to employ other ethylenically-unsaturated co-polymerizable monomers in addition to the foregoing monomers, either by admixture therewith or by separate addition either before or during the co-polymerizable reaction.

A thermal initiator can be added to enhance the co-polymerization reaction between the second ethylenically-unsaturated monomer and said hydroxy-functional monomer. Thermal initiators are well known and one skilled in the art will easily know how to select and use them, based on the disclosure herein. Examples of suitable thermal initiators include:
t-butylperoxy 2-ethylhexanoate,
t-butylperoxy benzoate,
t-butylperoxy pivalate,
t-amylperoxy 2-ethylhexanoate,
t-amylperoxybenzoate,
t-amylperoxypivalate, and
azo compounds such as azobisisobutyronitrile.

The second ethylenically-unsaturated monomer and the hydroxy-functional monomer can be added to the hydroxy-functional diluent before co-polymerizing the monomers, or, alternatively, said second ethylenically-unsaturated monomer and the hydroxy-functional monomer can be first co-polymerized to form the hydroxy-functional vinyl-addition copolymer which is thereafter dispersed or dissolved in the hydroxy-functional diluent.

Preferably, the hydroxy-functional diluent is heated to the reaction temperature for the reaction between said second ethylenically-unsaturated monomer and the hydroxy-functional monomer before they are added to said diluent. In this manner, by slow addition of the monomers to the heated diluent the co-polymerization reaction can be easily controlled and the temperature maintained. If all of the monomers are added to the heated diluent at once, the reaction may become violent and the temperature may increase out of control.

Examples of suitable hydroxy-functional ethylenically-unsaturated monomers include:
hydroxyethyl (meth)acrylate,
hydroxypropyl (meth)acrylate,
hydroxybutyl (meth)acrylate, and
hydroxy terminated (meth)acrylate prepolymers such as TONE prepolymers (Union Carbide). As used herein, the term (meth)acrylate includes methacrylate or acrylate compounds and mixtures thereof. Furthermore, hydroxy functionality can be introduced using e.g. glycidylacrylate in the polymer, and later hydrolysing the epoxy functionality, or reacting the epoxy functionality with an acid.

The hydroxy-functional monomer can suitably be present in an amount between about 0.1 and about 10% by weight, preferably, between about 0.1 and about 5% by weight. All weight percents used herein are based on the total weight of coating composition, unless otherwise noted.

Examples of suitable reactive hydroxy-functional diluents useful as the reaction medium employed according to this invention include the commercially available polyols P410, P710, P1010, and P2010 (BASF), PPG425, PPG725, PPG1025 and PPG2025 (Arco Chemical) and the polytetramethylene diols TERATHANE 650 and 1000 (Du Pont). Other low viscosity hydroxy-functional prepolymers and copolymers can also be used as well, such as the commercially available POLY G series of copolymers (Olin Corp.). Mixtures of such diluents may be used as desired.

While the dihydroxy-functional diluents are preferred, mono-hydroxy-functional diluents may be also used either in place of the above described di-functional diluents or in admixture therewith. Examples of suitable mono-functional diluents include the MPEG series of polymers (Union Carbide), ethoxylated derivatives of nonylphenol, such as the POLYSTEP series (Stepan Chem.), and $C_8$–$C_{20}$ alcohols, such as, the HARCHEMEX series (Union Camp). This invention provides great flexibility in tailoring the products of the method through varying and balancing the nature and amounts of the diluent, including the molecular weight and hydroxyl values thereof, providing that care is taken to avoid compositions which would tend to gel.

The hydroxy-functional diluent can suitably be present in an amount between about 10 and about 40% by weight, preferably, between about 15 and about 35% by weight.

Examples of suitable ethylenically-unsaturated co-polymerizable monomers include:
methyl (meth)acrylate,
2-ethylhexyl (meth)acrylate,
n-butyl (meth)acrylate,
i-butyl (meth)acrylate,
ethyl (meth)acrylate, vinyl acetate,
vinyl versatate,
isobornyl(meth)acrylate,
decyl(meth)acrylate,
stearyl(meth)acrylate,
ethoxyethoxyethylacrylate isodecyl(meth)acrylate,
vinyl caprolactam, N-vinyl pyrrolidone,
isooctyl(meth)acrylate,
N-isobutoxymethyl acrylamide,
N-methylol acrylamide,
(meth)acrylic acid, and
styrene.

The second ethylenically-unsaturated monomer, or mixtures thereof, can suitably be present in an amount of about 5 to about 50% by weight, preferably about 10 to about 40% by weight. If two such monomers are present each monomer may generally be present in an amount of, for example, about 2.5 to about 25% by weight, preferably about 5 to about 20% by weight.

It is possible to use some fluorinated acrylate monomers in the preparation of the vinyl addition polymers, in particular to decrease the adhesive strength of the coating. Thus, in inner primary optical fiber coatings, the ribbon stripping characteristics may be improved by using less than about 10 wt. % of fluorinated acrylate monomer. If a fluorinated acrylate monomer is used, it is preferably used in an amount of more than about 1 wt. %. The vinyl addition polymer, however, preferably is free from fluorine groups. Other useful monomers that can be copolymerised to achieve certain properties include, for example, silicon-monoacrylates.

The Tg and viscosity, respectively, of the hydroxy-functional vinyl addition copolymer, can be easily adjusted by varying the amount of and the selection of the monomer or monomers added. Preferably, two monomers are added. One skilled in the art will easily be able to adjust the Tg and viscosity to a desired level without undue experimentation, based on the description provided herein.

The Tg of the hydroxy-functional vinyl addition copolymer will directly affect the Tg of the urethane acrylate formed from the hydroxy-functional vinyl addition copolymer. The Tg of the urethane acrylate formed from the hydroxy-functional vinyl addition copolymer will in turn affect the Tg of the urethane acrylate mixture produced.

For example, if the mixture of the urethane oligomer (a) and urethane compound (b) is to be used in a radiation-curable coating composition for making an inner primary coating on an optical glass fiber, the Tg of the hydroxy-functional vinyl addition copolymer should be sufficiently low to provide a urethane oligomer and compound having an appropriate low Tg. In general, the lower the Tg of the hydroxy-functional vinyl addition copolymer, the lower the Tg of the urethane oligomer formed from the hydroxy-functional vinyl addition copolymer. Further, the lower the Tg of the urethane oligomer formed from the hydroxy-functional vinyl addition copolymer, the lower the Tg of the mixture formed. In general, a lower Tg of the mixture will result in a cured coating which is more flexible than a cured coating formed from a mixture having a higher Tg. In this manner, the Tg of the mixture produced can be easily increased or decreased by increasing or decreasing the Tg of the hydroxy-functional vinyl addition copolymer; of course the Tg of the mixture can be influenced by the choice of the hydroxy functional diluent.

The viscosity of the hydroxy-functional vinyl addition copolymer will directly affect the viscosity of the urethane oligomer formed from the hydroxy-functional vinyl addition copolymer. The viscosity of the urethane oligomer formed from the hydroxy-functional vinyl addition copolymer will also affect the viscosity of the mixture formed. For example, if the mixture formed is to be used in a radiation curable coating composition for coating optical glass fibers, the viscosity of the hydroxy-functional vinyl addition copolymer can be adjusted to provide a mixture having a viscosity which is suitable for application to optical glass fibers. In general, the lower the viscosity of the hydroxy-functional vinyl addition copolymer, the lower the viscosity of the urethane oligomer formed from the hydroxy-functional vinyl addition copolymer. The lower the viscosity of the urethane oligomer formed from the hydroxy-functional vinyl addition copolymer, the lower the viscosity of the mixture formed. Thus, the viscosity of the mixture formed can be increased or decreased by increasing or decreasing the viscosity of hydroxy-functional vinyl addition copolymer.

The viscosity of the mixture can be roughly adjusted by varying the type and quantity of monomers, as described above. Then, the viscosity of the mixture formed by this invention can be fine-tuned by adding an additional radiation-curable ethylenically-unsaturated diluent monomer, as is described hereinbelow.

Preferably, the hydroxy-functional vinyl addition copolymer produced is a terpolymer based on two ethylenically unsaturated monomers co-polymerized with the hydroxy-functional monomer.

After the hydroxy-functional vinyl addition copolymer is formed, the mixture is preferably heated to a temperature sufficient to quench out or remove the thermal initiator, if present. If the thermal initiator is allowed to remain in the composition, gelation may occur during the subsequent urethane acrylate synthesis.

The hydroxy-functional vinyl addition copolymer(s) and the reactive hydroxy functional diluent used as reaction medium are then converted to a urethane oligomer and compound by reacting them with a mono-functional isocyanate compound containing at least one radiation-curable functional group. Any functionally-suitable mono-functional isocyanate compound containing at least one radiation-curable functional group can be used. This reaction essentially replaces the reactive hydroxyl groups of both the hydroxy vinyl addition copolymer(s) and the hydroxy-functional diluent(s) with an reactive terminal group linked to the remainder of the molecule(s) through a urethane group. The product of the reactions is a mixture comprising a first urethane oligomer formed from the hydroxy-functional vinyl addition copolymer and a second urethane compound formed from the hydroxy-functional diluent.

The mono-functional isocyanate compound containing at least one reactive terminal group can suitably be present in an amount between about 15 and about 45% by weight, preferably, between about 20 and about 45% by weight.

The mono-functional isocyanate compound containing at least one reactive terminal group can be usefully made by reacting a polyisocyanate with a simple hydroxy functional compound with at least one functional group capable of polymerization in the presence of actinic radiation. Preferably, a diisocyanate is used to obtain a mono-functional isocyanate compound with a radiation-curable functional group. For example, isophorone diisocyanate can be reacted with hydroxyethyl acrylate to produce a mono-functional isocyanate compound containing one acrylate group. The isophorone diisocyanate has two isocyanate groups wherein one isocyanate group is about 12 times more reactive than the other isocyanate group. Thus, the hydroxy functional acrylate and diisocyanate should be selected and added in an amount and under suitable conditions so as to fully react only one of the isocyanate groups present on the diisocyanate. One skilled in the art will be able to determine the conditions which are suitable to carry out such reaction.

Examples of suitable diisocyanates for making the mono-functional isocyanate compound containing a reactive terminal group include:

isophorone diisocyanate (IPDI),
toluene diisocyanate (TDI),
4,4'-methylene-bis-cyclohexane diisocyanate,
diphenylmethane diisocyanate,
1,6-hexane diisocyanate,
2,2,4-trimethylhexamethylene diisocyanate,
m-phenylene diisocyanate,
4-chloro-1,3-phenylene diisocyanate,
4,4'-biphenylene diisocyanate,
1,5-naphthylene diisocyanate,
1,4-tetramethylene diisocyanate,
1,10-decamethylene diisocyanate,
1,4-cyclohexylene diisocyanate,
norbornene-diisocyanate, and
polyalkyloxide and polyester glycol diisocyanates such as polytetramethylene ether glycol terminated with TDI and polyethylene adipate terminated with TDI, respectively. Other suitable isocyanate functional compounds are for example isocyanate functional prepolymers such as the ADIPRENE® series (Uniroyal Chemicals). Preferably, the isocyanates are TDI and IPDI.

The compound providing a radiation-curable functional group contains a functional group which can polymerize under the influence of actinic radiation, and the compound contains a group which can react with an isocyanate. The group that can react with an isocyanate can be, for example, hydroxy, thiol, amine or the like. The group that can react with the isocyanate is preferably a hydroxy monomer. Hydroxy functional ethylenically unsaturated monomers are preferred. More preferably, the hydroxy functional ethylenically unsaturated monomer contains acrylate, (meth) acrylate, vinyl ether, maleate or fumarate functionality.

Monomers having (meth)acrylate functional groups include, for example, hydroxy functional acrylates such as 2-hydroxyethyl acrylate, 2-hydroxypropyl acrylate, and acrylate functional hydroxy functional prepolymers such as those commercially available as TONE M100 (Union Carbide) and the like. Monomers having vinyl ether functional groups include, for example, 4-hydroxybutyl vinyl ether, and triethylene glycol monovinyl ether. Monomers having maleate functional groups include, for example, maleic acid and hydroxy functional maleates.

Compounds providing a radiation-curable functional group with epoxy functionality include for example epichlorohydrin that can be reacted with an hydroxy group of the oligomer diol, or compounds having one or more epoxy groups and a hydroxy group that can be reacted with a polyisocyanate, for example, oligomers of bisphenol-A bis epoxy resins.

Compounds providing a radiation-curable functional group for amine-ene or thiol-ene systems can contain, for example, an allylic unsaturation, or tertiary amine or thiol groups. Thus, the oligomer can be provided with allylic unsaturation by reaction of an isocyanate with trimethylolpropanediallylether, or the oligomer can be provided with an amine functional group by reaction of the isocyanate with amine functional compounds. Such diluents include, for example:
the adduct of trimethylolpropane, isophoronediisocyanate and di(m)ethylethanolamine,
the adduct of hexanediol, isophoronediisocyanate and dipropylethanol amine, and
the adduct of diethylethanolamine, dimethylethanolamine or dipropylethanolamiane.
Preferably, the reactive termination of the oligomer for amine-ene or thiolene systems has an allylic unsaturation.

The relative amounts of mono-functional isocyanate compound containing a radiation-curable functional group, a hydroxy-functional vinyl addition copolymer and hydroxy-functional diluent are typically used so as to provide a ratio of from about 1:1 to about 1:5 of isocyanate groups:hydroxy groups (present in the hydroxy-functional vinyl addition copolymer and hydroxy-functional diluent). Preferably, the mono-functional isocyanate compound containing a reactive terminal group, the hydroxy-functional vinyl addition copolymer and the hydroxy-functional diluent are present in a substantially stoichiometric amount, which is about 1:1. For example, to determine the stoichiometric amount the hydroxyl value of the mixture of the hydroxy-functional vinyl addition copolymer and the hydroxy-functional diluent can be measured. Any known method for determining the hydroxyl value can be used. Once the hydroxyl value is known, one skilled in the art will then be able to easily determine the amount of monofunctional isocyanate required to fully react the hydroxyl groups present in the mixture of the hydroxy-functional vinyl addition copolymer and hydroxy-functional diluent.

A urethane-reaction catalyst can be employed for its well-known use to enhance the reaction between the mono-functional isocyanate compound containing a reactive terminal group and each of the hydroxy-functional vinyl addition copolymer and the hydroxy-functional diluent. An example of a preferred urethane-reaction catalyst is dibutyltin dilaurate.

A polymerization inhibitor can also be added for its known use to prevent polymerization of the reactive terminal groups during synthesis. Examples of suitable polymerization inhibitors for acrylates include phenothiazine and 2,6-di-t-butyl-4-methylphenol.

Preferably, the reaction between the hydroxy-functional vinyl addition copolymer and the mono-functional isocyanate compound containing a reactive terminal group as well as the reaction between the hydroxy-functional diluent and the mono-functional isocyanate compound containing a reactive terminal group are carried out until at least about 99% of the isocyanate groups are consumed. This can be determined, for example, by measuring the NCO amount present, as the reaction proceeds, using any well-known test method. optionally, the viscosity of the urethane oligomer mixture can be fine-tuned by also adding an additional radiation-curable diluent monomer. For example, if the urethane oligomer mixture formed is to be used as a radiation-curable coating for optical glass fibers, an amount of the additional diluent sufficient to adjust the viscosity to a desired level for such application may readily be determined by simple viscosity measurement on the mixture thereof with the urethane oligomer mixture.

The additional reactive diluent monomer can be for example a low viscosity oligomer containing a functional group having ethylenic unsaturation. Examples of suitable functional groups containing ethylenic unsaturation are those described above. Examples of such suitable diluent monomers include:
phenoxyethyl (meth)acrylate,
isobornyl (meth)acrylate,
lauryl (meth)acrylate,
isodecyl (meth)acrylate,
2-(2-ethoxyethoxy)ethyl (meth)acrylate,
N-vinyl pyrrolidone,
N-vinyl caprolactam,
N-isobutoxymethyl acrylamide,
hexanediol di(meth)acrylate, and
trimethylolpropane tri(meth)acrylate.

The resulting solvent-free, radiation curable mixture can be used as a radiation curable optical glass fiber coating composition by incorporating known stabilizers, photoinitiators, adhesion-promotors, light sensitive and light absorbing components, catalysts, initiators, lubricants, wetting agents, pigments, dyes, antioxidants or stabilizers for their respective known uses. One skilled in the art will easily be able to make and use such a composition without undue experimentation based on the disclosure presented herein. Furthermore, based on the disclosure herein, such a person will able to adjust the Tg of the solvent-free, coating compositions, as described above, to provide either inner or outer primary coatings, inks or matrix materials, on an optical glass fiber, as desired.

The coated optical glass fibers made according to this invention can be used in telecommunication systems. Such telecommunication systems typically include cables containing optical glass fibers, transmitters, receivers, and switches. The cables containing the optical glass fiber are the fundamental connecting units of telecommunication systems.

The coated optical glass fibers made according to this invention can also be adapted for enclosure within a cabled structure. The cabled structure can be buried under ground or water for long distance connections, such as between cities. Alternatively, the coated optical glass fibers can be adapted for use in local area networks, such as for connecting offices in high rise buildings, residential subdivisions, and the like. If the optical glass fiber is used for connections to residential homes, the thickness of the primary coatings can be increased, for example to about 400 nm, to thereby increase the durability of the optical glass fiber for handling purposes. Furthermore, the coated optical glass fibers can be adapted for use in ribbon cable applications.

The invention will be further explained by the following non-limiting examples. It will be noted that all examples shown herein are conducted in the absence of any solvent which, if present, would have to be removed before a suitable final composition would be obtained.

EXAMPLE 1

The hydroxy-functional diluent shown in Table 1 was heated to 80° C. under a nitrogen atmosphere in a first reaction vessel. The monomers 1 and 2, hydroxy-functional monomer, and the first addition of the thermal initiator shown in Table 1 were combined to form a monomer mixture. The monomer mixture was added to the heated hydroxy-functional diluent slowly over period of about 3 hours while maintaining the temperature at about 80° C. After the addition was complete, the temperature of the mixture was maintained at about 80° C. for about 1 hour and then the second addition of the thermal initiator was added.

The Tg of the resulting hydroxy-functional vinyl addition copolymer was determined by calculation using the well known FOX equation, as described in an article by T. Fox in the Bull. Amer. Phys. Soc., Vol 1, pg. 123, (1956). The viscosity (25° C.), and hydroxyl value of the resulting mixture of the hydroxy-functional vinyl addition copolymer and the hydroxy-functional diluent were measured. The results are shown in Tables 1 and 2 and explained following Table 2.

EXAMPLE 2

The method of Example 1 was followed, except using the reactants shown in Table 1 under Example 2, to produce a hydroxy-functional vinyl addition copolymer and hydroxy-functional diluent mixture.

The Tg of the hydroxy-functional vinyl addition copolymer produced was calculated as above. The viscosity (25° C.) and hydroxyl value of the mixture of the hydroxy-functional vinyl addition copolymer and the hydroxy-functional diluent were determined. The viscosity (25° C.) was measured using the procedure described below. The hydroxyl value was calculated. The results are shown in Tables 1 and 2 and explained following Table 2.

Next, the mono-functional isocyanate compound containing an acrylate group was made. In a second reaction vessel, the diisocyanate, the polymerization inhibitor and the urethane catalyst shown in Table 1 were combined under a dry air blanket. The hydroxy containing acrylate shown in Table 1 was added dropwise to the second reaction vessel over a period about 60 to about 90 minutes. The reaction temperature was kept below 35° C. After the addition was complete, the temperature was raised to about 40° C. held there for about 1 hour. The NCO content was then measured. An NCO value of about 12.3±0.5%. would indicate that substantially all of the hydroxy containing acrylate was reacted.

A stoichiometric amount of the hydroxy-functional vinyl addition copolymer/hydroxy-functional diluent mixture, calculated using the hydroxyl value, was added all at once to the mono-functional isocyanate compound containing an acrylate group in the second reaction vessel. The mixture was allowed to react under its own exotherm to about 80° C. The diluent monomer shown in Table 1 was then added and the mixture was held at 80° C. until substantially all of the isocyanate groups were reacted (the NCO was less than about 0.2%)

EXAMPLES 3–12

The process of Example 2 was followed except that after the second addition of thermal initiator was added, the mixture was heated to about 100° C. and held there for about three hours to quench out or remove the thermal initiator from the reaction mixture. The mixture was then cooled to 60° C. before adding to the second reactor vessel.

TABLE 1

| REACTANTS | | | |
|---|---|---|---|
| COMPONENT | EXAMPLE 1 | EXAMPLE 2 | EXAMPLE 3 |
| Monomer 1 | Methyl Methacrylate | Methyl Methacrylate | Methyl Methacrylate |
| Amount (g) | 168 | 87.5 | 95 |
| Monomer 2 | 2-Ethylhexyl Acrylate | 2-Ethylhexyl Acrylate | 2-Ethylhexyl Acrylate |
| Amount (g) | 102 | 137.5 | 142.5 |
| Hydroxy-Functional Monomer | 2-Hydroxyethyl Acrylate | 2-Hydroxyethyl Acrylate | 2-Hydroxyethyl Acrylate |
| Amount (g) | 30 | 25 | 12.5 |
| Thermal Initiator | t-Butylperoxy 2-Ethylhexanoate | t-Butylperoxy 2-Ethylhexanoate | t-Butylperoxy 2-Ethylhexanoate |
| 1st Addition (g) | 6.0 | 7.5 | 7.5 |

TABLE 1-continued

REACTANTS

| | | | |
|---|---|---|---|
| 2nd Addition (g) | .6 | .7 | .7 |
| Hydroxy Functional Diluent | P410 Polyol | P410 Polyol | P410 Polyol |
| Amount (g) | 200 | 250 | 250 |
| Hydroxyl Value[1] | 152 | 151.2 | 139.3 |
| Hydroxy-Functional Vinyl Addition Copolymer (g)[2] | — | 104.5 | 108.5 |
| Isocyanate | — | Isophoronediisocyanate | Isophoronediisocyanate |
| Amount (g) | — | 62.6 | 59.8 |
| Polymerization Inhibitor | — | Phenothiazine | Phenothiazine |
| Amount (g) | — | .12 | .25 |
| Urethane Catalyst | — | Dibutyltin Dilaurate | Dibutyltin Dilaurate |
| Amount (g) | — | .12 | .12 |
| Hydroxy Containing Acrylate | — | Hydroxyethyl Acrylate | Hydroxyethyl Acrylate |
| Amount (g) | — | 32.7 | 31.27 |
| Diluent Monomer | — | Phenoxyethyl Acrylate | Phenoxyethyl Acrylate |
| Amount (g) | — | 50 | 50 |

| COMPONENT | EXAMPLE 4 | EXAMPLE 5 | EXAMPLE 6 |
|---|---|---|---|
| Monomer 1 | Styrene | Methyl Methacrylate | Methyl Methacrylate |
| Amount (g) | 45 | 120 | 95 |
| Monomer 2 | n-Butyl Acrylate | 2-Ethylhexyl Acrylate | 2-Ethylhexyl Acrylate |
| Amount (g) | 192.5 | 117.5 | 142.5 |
| Hydroxy-Functional Monomer | 2-Hydroxyethyl Acrylate | 2-Hydroxyethyl Acrylate | 2-Hydroxyethyl Acrylate |
| Amount (g) | 12.5 | 12.5 | 12.5 |
| Thermal Initiator | t-Butylperoxy 2-Ethylhexanoate | t-Butylperoxy 2-Ethylhexanoate | t-Butylperoxy 2-Ethylhexanoate |
| 1st Addition (g) | 7.5 | 7.5 | 7.5 |
| 2nd Addition (g) | .7 | .7 | .7 |
| Hydroxy Functional Diluent | P2010 Polyol | P410 Polyol | P710 Polyol |
| Amount (g) | 250 | 250 | 250 |
| Hydroxyl Value[1] | 39.5 | 139.3 | 82.6 |
| Hydroxy-Functional Vinyl Addition Copolymer (g)[2] | 161.2 | 108.5 | 133.3 |
| Isocyanate | Isophoronediisocyanate | Isophoronediisocyanate | Isophoronediisocyanate |
| Amount (g) | 25.2 | 59.9 | 43.6 |
| Polymerization Inhibitor | 2,6-di4-Butyl-4-Methylphenol | Phenothiazine | 2,6-di-t-Butyl-4-Methylphenol |
| Amount (g) | .25 | .25 | .25 |
| Urethane Catalyst | Dibutyltin Dilaurate | Dibutyltin Dilaurate | Dibutyltin Dilaurate |
| Amount (g) | .12 | .13 | .13 |
| Hydroxy Containing Acrylate | Hydroxyethyl Acrylate | Hydroxyethyl Acrylate | Hydroxyethyl Acrylate |
| Amount (g) | 13.1 | 31.3 | 22.8 |
| Diluent Monomer | Isobornyl Acrylate | Isobornyl Acrylate | Isobornyl Acrylate |
| Amount (g) | 50 | 50 | 50 |

| COMPONENT | EXAMPLE 7 | EXAMPLE 8 | EXAMPLE 9 |
|---|---|---|---|
| Monomer 1 | Methyl Methacrylate | Styrene | Methyl Methacrylate |
| Amount (g) | 95 | 45 | 98.8 |
| Monomer 2 | 2-Ethylhexyl Acrylate | n-Butyi Acrylate | 2-Ethylhexyl Acrylate |
| Amount (g) | 142.5 | 192.5 | 146.2 |
| Hydroxy-Functional Monomer | 2-Hydroxyethyl Acrylate | 2-Hydroxyethyl Acrylate | 2-Hydroxyethyl Acrylate |
| Amount (g) | 12.5 | 12.5 | 5.0 |
| Thermal Initiator | t-Butylperoxy 2-Ethylhexanoate | t-Butylperoxy 2-Ethylhexanoate | t-Butylperoxy 2-Ethylhexanoate |
| 1st Addition (g) | 7.5 | 7.5 | 7.5 |
| 2nd Addition (g) | .7 | .7 | .7 |
| Hydroxy Functional Diluent | P2010 Polyol | P410 Polyol | P1010 Polyol |
| Amount (g) | 250 | 250 | 250 |
| Hydroxyl Value[1] | 39.5 | 108.5 | 57.7 |
| Hydroxy-Functional Vinyl Addition Copolymer (g)[2] | 161.2 | 161.2 | 148.0 |
| Isocyanate | Isophoronediisocyanate | Isophoronediisocyanate | Isophoronediisocyanate |
| Amount (g) | 25.2 | 59.9 | 34.0 |
| Polymerization Inhibitor | 2,6-di-t-Butyl-4-Methylphenol | 2,6-di4-Butyl-4-Methylphenol | 2,6-di-t-Butyl-4-Methylphenol |
| Amount (g) | .25 | .25 | .25 |
| Urethane Catalyst | Dibutyltin Dilaurate | Dibutyltin Dilaurate | Dibutyltin Dilaurate |
| Amount (g) | .13 | .13 | .13 |
| Hydroxy Containing Acrylate | Hydroxyethyl Acrylate | Hydroxyethyl Acrylate | Hydroxyethyl Acrylate |
| Amount (g) | 13.2 | 31.3 | 17.7 |
| Diluent Monomer | Isobornyl Acrylate | Isodecylacrylate | Isobornyl Acrylate |
| Amount (g) | 50 | 50 | 50 |

| COMPONENT | EXAMPLE 10 | EXAMPLE 11 | EXAMPLE 12 |
|---|---|---|---|
| Monomer 1 | Methyl Methacrylate | Styrene | Methyl Methacrylate |
| Amount (g) | 95.0 | 62.5 | 100.0 |
| Monomer 2 | 2-Ethylhexyl Acrylate | n-Butyl Acrylate | 2-Ethylhexyl Acrylate |
| Amount (g) | 142.5 | 137.5 | 147.5 |

TABLE 1-continued

REACTANTS

| | | | |
|---|---|---|---|
| Monomer 3 | — | 2-Ethylhexyl Acrylate | — |
| Amount (g) | 45.0 | — | — |
| Hydroxy-Functional Monomer | 2-Hydroxyethyl Acrylate | 2-Hydroxyethyl Acrylate | 2-Hydroxyethyl Acrylate |
| Amount (g) | 12.5 | 5.0 | 2.5 |
| Thermal Initiator | t-Butylperoxy 2-Ethylhexanoate | t-Butylperoxy 2-Ethylhexanoate | t-Butylperoxy 2-Ethylhexanoate |
| 1st Addition (g) | 7.5 | 7.5 | 7.5 |
| 2nd Addition (g) | 0.7 | 0.7 | 0.7 |
| Hydroxy Functional Diluent | Terathane 650 | Polystep F.1 | P1010 Polyol |
| Amount (g) | 250.0 | 250.0 | 250.0 |
| Hydroxyl Value[1] | 93.3 | 74.4 | 55.3 |
| Hydroxy-Functional Vinyl Addition Copolymer (g)[2] | 127.6 | 137.7 | 149.7 |
| Isocyanate | Isophoronediisocyanate | Isophoronediisocyanate | Isophoronediisocyanate |
| Amount (g) | 47.4 | 40.8 | 32.8 |
| Polymerization Inhibitor | 2,6-di4-Butyl-4-Methylphenol | 2,6-di-t-Butyl-4-Methylphenol | 2,6-di-t-Butyl-4-Methylphenol |
| Amount (g) | 0.25 | 0.25 | 0.25 |
| Urethane Catalyst | Dibutyltin Dilaurate | Dibutyltin Dilaurate | Dibutyltin Dilaurate |
| Amount (g) | 0.13 | 0.13 | 0.13 |
| Hydroxy Containing Acrylate | Hydroxyethyl Acrylate | Hydroxyethyl Acrylate | Hydroxyethyl Acrylate |
| Amount (g) | 24.6 | 21.2 | 17.1 |
| Diluent Monomer | Ageflex MEA | Isobornyl Acrylate | Isobornyl Acrylate |
| Amount (g) | 50.0 | 50.0 | 50.0 |

[1]The Hydroxyl Value shown in Table 1 is the total hydroxyl value of the hydroxy functional diluent and hydroxy-functional vinyl addition, copolymer produced.
[2]The "Hydroxy-Functional Vinyl Addition Copolymer (g)" shown in Table 1 represents the amount of the hydroxy functional diluent and hydroxy functional vinyl addition copolymer mixture added to the monofunctional isocyanate having an acrylate functional group.

[1]The Hydroxyl Value shown in Table 1 is the total hydroxyl value of the hydroxy functional diluent and hydroxy-functional vinyl addition copolymer produced.

[2]The "Hydroxy-Functional Vinyl Addition Copolymer (g)" shown in Table 1 represents the amount of the hydroxy functional diluent and hydroxy functional vinyl addition copolymer mixture added to the monofunctional isocyanate having an acrylate functional group.

In Table 1, the various reactants were purchased from the following manufacturers:
Methyl Methacrylate (Rohm & Haas or Ashland Chemical);
2-Ethylhexyl Acrylate (Ashland Chemical);
2-Hydroxyethyl Acrylate (Dow, HEA, or Rohm & Haas, Rocryl 420);
n-Butyl Acrylate (Ashland Chemical);
Styrene (Ashland Chemical);
Phenoxyethyl Acrylate (Sartomer, SR 339);
Isobornyl Acrylate (Radcure Specialties or Sartomer, SR 506);
2-(2-Ethoxyethoxy)Ethyl Acrylate (Morton International, RC20, or Sartomer SR 256);
Isodecyl Acrylate (Sartomer, SR 395, or CPS Chemical Co., Ageflex FA-10);
2-Methoxyethyl Acrylate (CPS Chem. Co., Ageflex MEA);
Polyols P410, P710, P1010, P2010 (BASF) or PPG425, PPG725, PPG1025, PPG2025 (Arco Chemical) (the number after the "P" or "PPG" represents the molecular weight);
POLYSTEP™ F-1 (Ethoxylated Nonylphenol, Stepan Chemical);
TERATHANE 650 a polyetetramethylene diol (Du Pont);
t-Butylperoxy 2-Ethylhexanoate (Aztec Catalysts);
2-Hydroxy-2-Methyl-1-Phenypropan-1-One (Ciba-Geigy, Darocure 1173);
Phenothiazine (ICI);
2,6-di-t-Butyl-4-Methylphenol (Fitz Chemical);
Dibutyltin Dilaurate (M&T Chemicals); and
Isophorone diisocyanate (Huls, or Olin).

TABLE 2

EXPERIMENTAL RESULTS

| COMPONENT | EXAMPLE 1 | EXAMPLE 2 | EXAMPLE 3 |
|---|---|---|---|
| Monomer 1 | Methyl Methacrylate | Methyl Methacrylate | Methyl Methacrylate |
| Relative Monomer Weight (%) | 56 | 35 | 38 |
| Monomer 2 | 2-Ethylhexyl Acrylate | 2-Ethylhexyl Acrylate | 2-Ethylhexyl Acrylate |
| Relative Monomer Weight (%) | 34 | 55 | 57 |
| Hydroxy-Functional Monomer | 2-Hydroxyethyl Acrylate | 2-Hydroxyethyl Acrylate | 2-Hydroxyethyl Acrylate |
| Relative Monomer Weight (%) | 10 | 10 | 5 |
| Viscosity of Hydroxy-Functional Vinyl Addition Copolymer and Hydroxy Functional Diluent Mixture 25° C. (Pa · s) | 1,000,000 | 57.3 | 64 |
| Tg of Hydroxy-Functional Vinyl Addition Copolymer (°C.) | 0.3 | −35.4 | −34.9 |
| Viscosity of Urethane Acrylate Mixture 25° C. (Pa · s) | — | gelled | 290.5 |

TABLE 2-continued

EXPERIMENTAL RESULTS

| COMPONENT | EXAMPLE 4 | EXAMPLE 5 | EXAMPLE 6 |
|---|---|---|---|
| Monomer 1 | Styrene | Methyl Methacrylate | Methyl Methacrylate |
| Relative Monomer Weight (%) | 18 | 48 | 38 |
| Monomer 2 | n-Butyl Acrylate | 2-Ethylhexyl Acrylate | 2-Ethylhexyl Acrylate |
| Relative Monomer Weight (%) | 77 | 47 | 57 |
| Hydroxy-Functional Monomer | 2-Hydroxyethyl Acrylate | 2-Hydroxyethyl Acrylate | 2-Hydroxyethyl Acrylate |
| Relative Monomer Weight (%) | 5 | 5 | 5 |
| Viscosity of Hydroxy-Functional Vinyl Addition Copolymer and Hydroxy Functional Diluent Mixture 25° C. (Pa · s) | 68 | 332 | 112.5 |
| Tg of Hydroxy-Functional Vinyl Addition Copolymer (°C.) | −34.5 | −19 | −34.9 |
| Viscosity of Urethane Acrylate Mixture 25° C. (Pa · s) | gelled | 1,000,000 | 1,000,000 |

| COMPONENT | EXAMPLE 7 | EXAMPLE 8 | EXAMPLE 9 |
|---|---|---|---|
| Monomer 1 | Methyl Methacrylate | Styrene | Methyl Methacrylate |
| Relative Monomer Weight (%) | 38 | 18 | 39 |
| Monomer 2 | 2-Ethylhexyl Acrylate | n-Butyl Acrylate | 2-Ethylhexyl Acrylate |
| Relative Monomer Weight (%) | 57 | 77 | 59 |
| Hydroxy-Functional Monomer | 2-Hydroxyethyl Acrylate | 2-Hydroxyethyl Acrylate | 2-Hydroxyethyl Acrylate |
| Relative Monomer Weight (%) | 5 | 5 | 2 |
| Viscosity of Hydroxy-Functional Vinyl Addition Copolymer and Hydroxy Functional Diluent Mixture 25° C. (Pa · s) | 233.0 | 16.8 | 122.2 |
| Tg of Hydroxy-Functional Vinyl Addition Copolymer (°C.) | −34.9 | −35.0 | −35.0 |
| Viscosity of Urethane Acrylate Mixture 25° C. (Pa · s) | gelled | 110.5 | 137.5 |

| COMPONENT | EXAMPLE 10 | EXAMPLE 11 | EXAMPLE 12 |
|---|---|---|---|
| Monomer 1 | Methyl Methacrylate | Styrene | Methyl Methacrylate |
| Relative Monomer Weight (%) | 38 | 25 | 40 |
| Monomer 2 | 2-Ethylhexyl Acrylate | n-Butyl Acrylate | 2-Ethylhexyl Acrylate |
| Relative Monomer Weight (%) | 57 | 55 | 59 |
| Monomer 3 | — | 2-Ethylhexyl Acrylate | — |
| Relative Monomer Weight (%) | | 18 | |
| Hydroxy-Functional Monomer | 2-Hydroxyethyl Acrylate | 2-Hydroxyethyl Acrylate | 2-Hydroxyethyl Acrylate |
| Relative Monomer Weight (%) | 5 | 2 | 1 |
| Viscosity of Hydroxy-Functional Vinyl Addition Copolymer and Hydroxy Functional Diluent Mixture 25° C. (Pa · s) | Soft Waxy Solid | 76.5 | 113.0 |
| Tg of Hydroxy-Functional Vinyl Addition Copolymer (°C.) | −34.9 | −35.3 | −35.0 |
| Viscosity of Urethane Acrylate Mixture 25° C. (Pa · s) | 21.3 | 124 | 113 |

The results in Table 2 demonstrate that the Tg of the hydroxy-functional vinyl addition copolymer and the viscosity of the urethane acrylate composition can be easily adjusted by varying the relative quantity of co-monomers 1 and 2. In particular, by comparing Examples 3 and 5 it can be seen that varying the relative amount of the co-monomers 1 and 2 drastically altered the viscosity of the urethane acrylate composition from 290.5 in Example 3 to 1,000,000 in Example 5. Furthermore, by varying the relative amounts of the ethylenically unsaturated monomers 1 and 2, the Tg was raised from −34.5, in Example 3, to −19, in Example 5.

By comparing the results of Examples 1, 3, and 5, it can be seen that the Tg of the hydroxy-functional vinyl addition copolymer generally has a significant effect on the viscosity of the hydroxy-functional vinyl addition copolymer/hydroxy-functional diluent mixture. In general, it can be seen that the lower the Tg of the hydroxy-functional vinyl addition copolymer, the lower the viscosity of the hydroxy-functional vinyl addition copolymer/hydroxy-functional diluent mixture.

By comparing the results of Examples 3 and 6, it can be seen that the molecular weight of the hydroxy-functional diluent also has an effect on the viscosity of the hydroxy-functional vinyl addition copolymer/hydroxy-functional diluent mixture. In Example 3, phenoxyethyl acrylate has a molecular weight of 192.2, and in Example 6, isobornyl acrylate has a molecular weight of 208.3. In general, the lower the molecular weight of the hydroxy-functional vinyl addition copolymer, the lower the viscosity of the hydroxy-functional vinyl addition copolymer/hydroxy-functional diluent mixture.

If a colorless urethane acrylate composition is desired, 2,6,di-t-butyl-4-methylphenol can be used as the polymerization inhibitor. The urethane acrylate compositions produced which using phenothiazine as the polymerization inhibitor had a yellowish color.

EXAMPLE 13–17

The mixtures obtained in example 3 and 6 were each separately combined with the diluent shown in Table 3 and a photoinitiator, (Darocure 1173; Ciba Geigy) in an amount of 0.9 grams DAROCURE per 30 grams of coating composition, to make five radiation curable coating compositions. 3 mil films were cast of each coating composition onto a polyester sheet using a BIRD bar applicator. Then the liquid composition was cured on the polyester by exposure to UV light from a Fusion Systems D lamp, under a nitrogen atmosphere, at a dosage of 1 Joule/cm$^2$. The tensile strength, modulus, and elongation of the cured film were determined and the results are shown in Table 3.

TABLE 3

|  | Example 13 | Example 14 | Example 15 | Example 16 | Example 17 |
|---|---|---|---|---|---|
| Oligomer Composition | Example 3 | Example 3 | Example 6 | Example 6 | Example 6 |
| Diluent | Phenoxyethyl Acrylate | Isobornyl Acrylate | Isobornyl Acrylate | Isodecyl Acrylate | 2-(2-Ethoxyethoxy) ethyl Acrylate |
| Oligomer Concentration | 40. | 40. | 40. | 40. | 40. |
| Tensile Strength (MPa) | 1.9 | 23 | 27 | 0.3 | 0.4 |
| Elongation (%) | 86 | 24 | 10 | 48 | 38 |
| Modulus (MPa) | 3.5 | 829 | 909 | 1.0 | 1.3 |

$^1$Concentration of oligomer composition (either Example 3 or Example 6) in the diluent.

The results in Table 3 demonstrate that the solvent-free, radiation-curable, coating compositions made according to the present invention can be designed for use as either inner or outer primary optical glass fiber coatings. For example, compositions as described in Example 14 and 15 may be used to produce an outer primary coating on an optical glass fiber because the modulus was greater than about 500 MPa. On the other hand, compositions as described in examples 13, 16 and 17 are suitable for use as an inner primary coating on an optical glass fiber because the modulus was less than about 10 MPa.

EXAMPLES 18–25

The mixtures obtained in Table 1, examples 8–12 were used to make optical fiber coatings analogous to examples 13–17. The results are shown in Table 4.

TABLE 4

| Example | Mixture from Example | Diluent | Oligomer % concentration | Tensile strength MPa | Elongation % | Modulus MPa |
|---|---|---|---|---|---|---|
| 18 | 8 | isobornyl acrylate | 40 | 18 | 98 | 563 |
| 19 | 9 | isodecyl acrylate | 40 | 0.2 | 61 | 0.6 |
| 20 | 10 | methoxyethyl acrylate | 40 | 0.8 | 73 | 1.9 |
| 21 | 11 | isobornyl acrylate | 40 | 18 | 6 | 624 |
| 22 | 11 | ethoxyethoxy ethylacrylate | 40 | o.1 | 62 | 0.4 |
| 23 | 11 | phenoxylethyl acrylate | 40 | 1.0 | 176 | 1.3 |
| 24 | 12 | isobornyl acrylate | 40 | 13.0 | 154 | 341 |
| 25 | 12 | isodecyl acrylate | 40 | 0.2 | 60 | 0.6 |

EXAMPLES 26–33

The resin mixture obtained in example 9 was further combined with several diluents to prepare optical fiber coatings and cured films. The compositions, and test results are summarized in Table 5.

TABLE 5

|  | Example | | | | | | | |
|---|---|---|---|---|---|---|---|---|
|  | 26 | 27 | 28 | 29 | 30 | 31 | 32 | 33 |
| Resin mixture example 9* | 24.0 | 15.0 | 15.0 | 18.0 | 26.3 | 15.0 | 15.0 | 18.8 |
| Isodecyl Acrylate | 6.0 | 15.0 | 6.0 | 9.0 | — | — | — | — |
| Phenoxy Ethylacrylate | — | — | 9.0 | 3.0 | — | — | — | — |
| Isobornyl Acrylate |  |  |  |  | 3.7 | 15.0 | 6.0 | 8.2 |
| Hexane Diol Diacrylate | — | — | 9.0 | 3.0 |  |  |  |  |

TABLE 5-continued

|  | Example | | | | | | | |
| --- | --- | --- | --- | --- | --- | --- | --- | --- |
|  | 26 | 27 | 28 | 29 | 30 | 31 | 32 | 33 |
| IRGACURE 184*** | 0.9 | 0.9 | 0.9 | 0.9 | 0.9 | 0.9 | 0.9 | 0.9 |
| IRGANOX 1035**** | 0.15 | 0.15 | 0.15 | 0.15 | 0.15 | 0.15 | 0.15 | 0.15 |
| CYAGARD UV416***** |  |  |  |  | 0.15 | 0.15 | 0.15 | 0.15 |
| % Oligomer** | 64 | 40 | 40 | 48 | 70 | 40 | 40 | 50 |
| Viscosity (mPa · s) | 9625 | 385 | 640 | 1230 | 46750 | 1300 | 790 | 3200 |
| Tensile strength (MPa) | 0.5 | 0.2 | 0.3 | 0.3 | 2.1 | 14.0 | 17.0 | 10.0 |
| Elongation (%) | 50 | 54 | 45 | 44 | 138 | 215 | 17 | 65 |
| Modulus (MPa) | 1.4 | 0.6 | 0.9 | 1.0 | 2.8 | 190 | 358 | 111 |

*80% oligomers in 20% isobornylacrylate.
**% is amount of oligomers (a) and (b)
***1-Hydroxycyclohexyl Phenyl Ketone (Ciba Geigy)
****Thiodiethylene bis-(3,5-di-tert-butyl-4-hydroxy)hydrocinnamate (ciba Geigy)
*****2-Hydroxy, 4-Acryloyloxy Ethoxy Benzophenone (Cytec Industries)

TEST PROCEDURES

Tensile Strength, Elongation, and Modulus

The tensile strength, elongation, and modulus were measured using a universal testing instrument, INSTRON Model 4201 equipped with a personal computer and software "Series IX Materials Testing System." The load cells used were 2 and 20 pound capacity. The ASTM D638M was followed, with the following modifications:

A drawdown of the material to be tested was made on a glass plate and cured using a UV processor. The cured film was conditioned at 23°±2° C. and 50±5% relative humidity for a minimum of sixteen hours prior to testing.

A minimum of eight test specimens, having a width of 0.5±0.002 inches and a length of 5 inches, were cut from the cured film. To minimize the effects of minor sample defects, sample specimens were cut parallel to the direction in which the drawdown of the cured film was prepared. If the cured film was tacky to the touch, a small amount of talc was applied to the film surface using a cotton tipped applicator.

The test specimens were then removed from the substrate. Caution was exercised so that the test specimens were not stretched past their elastic limit during the removal from the substrate. If any noticeable change in sample length had taken place during removal from the substrate, the test specimen was discarded.

If the top surface of the film was talc coated to eliminate tackiness, then a small amount of talc was applied to the bottom surface of test specimen after removal from the substrate.

The average film thickness of the test specimens was determined. At least five measurements of film thickness were made in the area to be tested (from top to bottom) and the average value used for calculations. If any of the measured values of film thickness deviated from the average by more than 10% relative, the test specimen was discarded. All specimens came from the same plate.

The appropriate load cell was determined by using the following equation:

$$[A \times 145] \times 0.0015 = C$$

Where: A=Product's maximum expected tensile strength (MPa); 145=Conversion Factor from MPa to psi; 0.00015= approximate cross-sectional area (in$^2$) of test specimens; and C=lbs. The 2 pound load cell was used for materials where C=1.8 lbs. The 20 pound load cell was used for materials where 1.8<C<18 lbs. If C>19, a higher capacity load cell was required.

The crosshead speed was set to 1.00 inch/min, and the crosshead action was set to "return at break". The crosshead was adjusted to 2.00 inches jaw separation. The air pressure for the pneumatic grips was turned on and adjusted as follows: set approximately 20 psi (1.5 Kg/cm$^2$) for primary optical fiber coatings and other very soft coatings; set approximately 40 psi (3 Kg/cm$^2$) for optical fiber single coats; and set approximately 60 psi (4.5 Kg/cm$^2$) for secondary optical fiber coatings and other hard coatings. The appropriate Instron computer method was loaded for the coating to be analyzed.

After the INSTRON test instrument had been allowed to warm-up for fifteen minutes, it was calibrated and balanced following the manufacturer's operating procedures.

The temperature near the Instron Instrument was measured and the humidity was measured at the location of the humidity gage. This was done just before beginning measurement of the first test specimen.

Specimens were analyzed under such conditions that the temperature was within the range 23°±1.0° C. and the relative humidity was within 50±5%. The temperature was within this range for each test specimen. The humidity value was verified at the beginning and the end of testing a set of specimens from one plate.

Each test specimen was tested by suspending it into the space between the upper pneumatic grips such that the test specimen was centered laterally and hanging vertically. Only the upper grip was locked. The lower end of the test specimen was pulled gently so that it has no slack or buckling, and it was centered laterally in the space between the open lower grips. While holding the specimen in this position, the lower grip was locked.

The sample number was entered and sample dimensions into the data system, following the instructions provided by the software package.

The temperature and humidity were measured after the last test specimen from the current drawdown was tested. The calculation of tensile properties was performed automatically by the software package.

Viscosity

The viscosity was measured using a PHYSICA MC10 Viscometer. The test samples were examined and if an excessive amount of bubbles was present, steps were taken to remove most of the bubbles. Not all bubbles need to be removed at this stage, because the act of sample loading introduces some bubbles.

The instrument was set up for the conventional Z4 system, which was used. The samples were loaded into a disposable aluminum cup by using the syringe to measure out about 3 cc. The sample in the cup was examined and if it contains an excessive amount of bubbles, they were removed by a direct means such as centrifugation, or enough time was allowed to elapse to let the bubbles escape from the bulk of the liquid. Bubbles at the top surface of the liquid are acceptable.

The bob was gently lowered into the liquid in the measuring cup, and the cup and bob were installed in the instrument. The sample temperature was allowed to equilibrate with the temperature of the circulating liquid by waiting five minutes.

Then, the rotational speed was set to a desired value which will produce the desired shear rate. The desired value of the shear rate is easily determined by one of ordinary skill in the art from an expected viscosity range of the sample.

The instrument panel read out a viscosity value, and if the viscosity value varied only slightly (less than 2% relative variation) for 15 seconds, the measurement was complete. If not, it is possible that the temperature had not yet reached an equilibrium value, or that the material was changing due to shearing. If the latter case, further testing at different shear rates will be needed to define the samples viscous properties.

The results reported are the average viscosity values of three test samples.

From the results of the above examples and the related descriptions herein, one skilled in the art will be able, following the principles of this invention, to selectively form the respective copolymers and components of the reaction scheme and adjust reaction conditions in such manner as to prepare either inner or outer primary UV-curable coatings for, e.g., optical glass fibers, and in so doing the conventional need for a solvent removal step following the urethane-forming stage will be avoided. In particular, it is evident that a wide variation in coating compositions may be obtained by controlling, adjusting and balancing the respective compositional make-up and properties of the components of the system, in particular the molecular weight and hydroxyl number, and the viscosity of the components and the final composition. The flexibility and adaptability of this solvent-free method provided by this invention is enhanced in that measurement and adjustment of such properties is facilitated by the absence of a need to remove the solvent before the characteristics of the product can be ascertained.

What is claimed is:

1. A radiation curable, optical glass fiber coating composition containing:
   a) a urethane-containing polymer, with a vinyl addition polymer backbone, having at least one functional group capable of polymerization in the presence of actinic radiation and an average functionality of at least about 1.2;
   b) a urethane compound, with a hydrocarbon, a polyether, a polyester, a polycarbonate, a silicone or a fluorocarbon backbone, having at least one functional group capable of polymerization in the presence of actinic radiation and an average functionality of at least about 1; and
   c) a reactive diluent
      wherein said urethane-containing polymer is derived from a solvent-free urethane-forming reaction.

2. Coating composition according to claim 1, comprising about 5 wt. % to about 70 wt. % of the urethane-containing polymer (a), about 5 wt. % to about 70 wt. % of the urethane compound (b), and about 5 wt. % to about 70 wt. % of one or more reactive diluents (c).

3. Coating composition according to claim 2, comprising about 15 wt. % to about 50 wt. % of urethane-containing polymer (a), about 15 wt. % to about 50 wt. % of urethane compound (b), and about 10 to about 70 wt. % of one or more reactive diluents (c).

4. Coating composition according to claim 1, wherein the composition further comprises 0.1–10 wt. % photoinitiator.

5. Coating composition according to claim 1, wherein the functional groups capable of polymerization in the presence of actinic radiation are selected from the group of acrylate, methacrylate or vinylether groups.

6. Coating composition according to claim 5, wherein said functional groups are acrylate groups.

7. Coating composition according to claim 1, wherein said urethane-containing polymer (a) has a number average molecular weight between 1000–200,000.

8. Coating composition according to claim 1, wherein said urethane-containing polymer (a) has a functionality of at least about 1.8 and lower than about 20.

9. Coating composition according to claim 1, wherein said urethane-containing polymer (a) has a vinyl addition polymer as backbone, which polymer has a calculated Tg lower than about 0° C.

10. Coating composition according to claim 1, wherein said urethane compound (b) has a number average molecular weight between about 300 to about 10,000.

11. Coating composition according to claim 1, wherein said urethane compound (b) comprises a backbone being a polyether or hydrocarbon.

12. Coating composition according to claim 1 wherein the reactive diluent (c) contains one or more acrylate, vinyl ether, or N-vinyl groups.

13. Coating composition according to claim 1 wherein the reactive diluent (c) has a molecular weight of less than about 550 or a viscosity at room temperature of less than about 300 mPa.s (measured as 100% diluent).

14. A radiation curable, optical glass fiber coating composition comprising:
   (i) a urethane-containing polymer comprising a vinyl addition polymer backbone and at least one functional group capable of polymerization in the presence of actinic radiation;
   (ii) a urethane compound comprising a hydrocarbon, a polyether, a polyester, a polycarbonate, a silicone or a fluorocarbon backbone and at least one functional group capable of polymerization in the presence of actinic radiation; and
   (iii) at least one reactive diluent
      wherein said urethane-containing polymer is derived from a solvent-free urethane-forming reaction.

15. The coating composition according to claim 14, wherein said urethane-containing polymer (i) has an average functionality of at least about 1.2 and said urethane compound (ii) has an average functionality of at least about 1.

16. The coating composition according to claim 14, comprising about 5 wt. % to about 70 wt. %, of the total composition, of said urethane-containing polymer (i), about 5 wt. % to about 70 wt. %, of the total composition, of said urethane compound (ii), and about 5 wt. % to about 70 wt. %, of the total composition, of said at least one reactive diluent (iii).

17. The coating composition according to claim 14, comprising about 15 wt. % to about 50 wt. %, of the total composition, of said urethane-containing polymer (i), about 15 wt. % to about 50 wt. %, of the total composition, of said urethane compound (ii), and about 10 to about 70 wt. %, of the total composition, of one or more reactive diluents (iii).

18. The coating composition according to claim 14, wherein the composition further comprises 0.1–10 wt. %, relative to the total composition, of at least one photoinitiator.

19. The coating composition according to claim 14, wherein the functional groups capable of polymerization in the presence of actinic radiation are selected from the group of acrylate, methacrylate or vinylether groups.

20. The coating composition according to claim 19, wherein said functional groups are acrylate groups.

21. The coating composition according to claim 14, wherein said urethane-containing polymer (i) has a number average molecular weight between 1,000–200,000.

22. The coating composition according to claim 14, wherein said urethane-containing polymer (i) has a functionality of at least about 1.8 and lower than about 20.

23. The coating composition according to claim 14, wherein said vinyl addition polymer backbone of said urethane-containing polymer (i) has a calculated Tg lower than about 0° C.

24. The coating composition according to claim 14, wherein said urethane compound (ii) has a number average molecular weight between about 300 to about 10,000.

25. The coating composition according to claim 14, wherein said urethane compound (ii) has a polyether or hydrocarbon backbone.

26. The coating composition according to claim 14, wherein the reactive diluent contains one or more acrylate, vinyl ether, or N-vinyl groups.

27. The coating composition according to claim 14, wherein the reactive diluent has a molecular weight of less than about 550 or a viscosity at room temperature of less than about 300 mPa.s (measured as 100% diluent).

* * * * *